Jan. 31, 1967 I. F. BARDITCH 3,302,079

DIGITAL UNIBLOCK GATE STRUCTURE

Filed Nov. 5, 1964

INVENTOR.
Irving F. Barditch

BY Gordon K. Telfer

ATTORNEY

United States Patent Office 3,302,079
Patented Jan. 31, 1967

3,302,079

DIGITAL UNIBLOCK GATE STRUCTURE

Irving F. Barditch, Baltimore, Md., assignor to Westinghouse Electric Corporation, East Pittsburgh, Pa., a corporation of Pennsylvania Filed Nov. 5, 1964, Ser. No. 409,245
1 Claim. (Cl. 317—235)

This invention relates to semiconductor devices and more particularly to a semiconductor gate structure which includes in one unit a transistor, resistor and a plurality of diodes and in which one side of the diodes and the transistor base are a common region.

In the past few years the development of new materials and production methods has resulted in making individual electronic components very small. This has been accomplished while still maintaining maximum reliability with minimum weight, size and power consumption. The degree of future miniaturization, however, is limited by the difficulty inherent in handling very small electronic components and the adverse effect that this handling has on the ultimate reliability of the equipment.

In the past, it was common practice in assembling a piece of equipment, to join together several components, such, for example, as by soldering. This practice, however, led to undue size and weight, as well as to power dissipation. For example, in digital type equipment and in particular in the typical "nand/nor" type of circuit, three diodes were connected in shunt to a resistor and the output was then connected to an amplifier. In order to achieve the greatest reduction in size and weight, as well as power dissipation, in digital type equipment, it is desirable to provide an aggregate structure which includes diodes and amplifying semiconductor structures.

In view of the foregoing, the primary object of the present invention is to provide a semiconductor device of new and improved form.

A further object of the present invention is to provide a semiconductor gate structure with a single region, in which the substrate serves as a resistor, as one side of the diodes, and as the transistor base.

Another object of the present invention is to provide a monolithic device including an adjustable resistor, a transistor and a plurality of diodes in which the diode cathodes and the transistor base are a common region.

Yet another object of the present invention is to provide a semiconductor gate structure in which a plurality of diodes, a resistor and an amplifier are combined into one unit to provide a unit having fast response diodes, fast transistors and which can be operated with low voltage and with reduced capacity transit time.

These and further features and objects of the present invention will appear from a reading of the following detailed description of a preferred embodiment of the invention, to be read in conjunction with the accompanying drawings wherein similar parts in the various views are identified by the same reference numeral.

Figure 1:
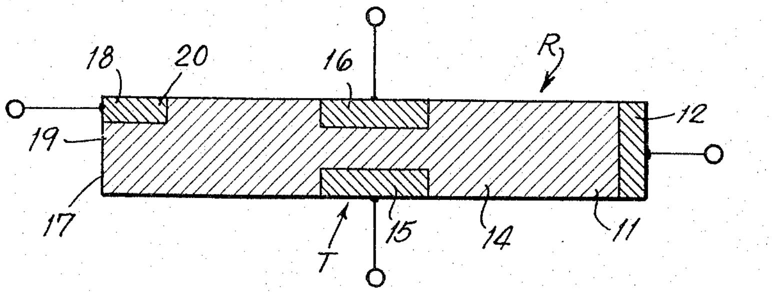
FIGURE 1 is a sectionalized elevational view of one embodiment of the invention.
Figure 2:
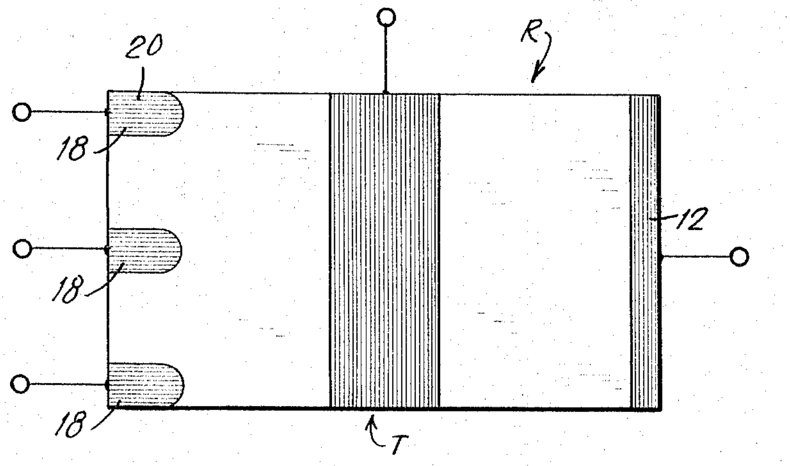
FIGURE 2 is a top plan view of the device illustrated in FIGURE 1.
Figure 3:
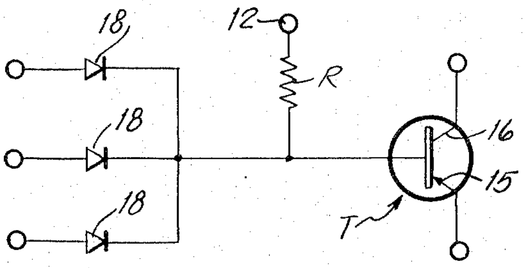
FIGURE 3 is an electrically equivalent diagram of the device illustrated in FIGURES 1 and 2.

Briefly stated, the present invention provides a fundamental electronic building block by combining a plurality of diodes, a resistor and an amplifier into one unit. The device of the present invention basically consists of a rectangular oblong wafer of semiconductor material such as germanium, silicon, or the like of N or P-type conductivity. One end of the wafer has attached thereto a conductive layer, while the other end of the wafer is doped by diffusion or alloying to form a thin layer of oppositely conductive material. The end of the wafer doped with oppositely conductive material is then treated in any well-known manner in order to divide it into a number of sectors in order to form the individual gating diodes of the device of the present invention. At a portion of the wafer removed from the diode structures, the top and bottom surfaces of the wafer are doped by diffusion or alloying to form thin layers of oppositely conductive material. These serve to form the transistor amplifying structure of the device of the present invention. The bulk resistivity of the wafer acts as a pull up resistor and therefore when used as a gate structure no external components are needed other than connecting means. High performance is achieved with the device of the present invention since all signals to the diode gates must pass through the base of the transistor amplifier.

Referring now to the figures, the device of the present invention includes a body R of semiconductor material of germanium, silicon or the like of N type or P type conductivity. One end 11 of the body R has attached thereto a conductive layer 12. At a portion removed from the end 11, the body 10 includes a portion T which comprises either a PNP or a NPN transistor. For example, the body R may be N type germanium and the portion T may comprise a PNP transistor having an N type body 14 and having one P type region 15 intended to be operated as an emitter electrode and another P type region 16 intended for operation as a collector electrode. The other end 17 of the body R includes portions 18 which are the gating diodes. The gating diodes 18 comprise PN junctions. Each of the PN junctions 18 include a portion 19 of the N type body R and a zone 20 of P type material.

In the preparation of the device of the present invention, the basic element is the semiconductor body R, which, for example, is in the form of an elongated rectangular, crystal of N type germanium. The semiconductor crystal is provided with the PN gating diodes 18 and the PN junction emitter and collector electrodes 15 and 16 by any suitable method. For example, the end 17 of the body R can have alloyed thereto a metal containing a P type impurity such as indium to form P type germanium. Portions of the P type germanium are then removed, such, for example, as by etching with acid, in order to form the gating diodes 18. If desired, a masked diffusion technique may be used instead of etching. At a distance removed from the end 17, the top and bottom portions of the body R have alloyed thereto material to form P type germanium. The transistor T is then formed by removing portions of the P type germanium by etching with acid. The conductive layer 12 is then attached to end 11 of the body R removed from the end 17 of the body 10 having the diodes 18. The diodes 18 and transistor T are of course preferably formed at the same time and in the same operation.

Since the semiconductor body R has a bulk resistivity this is used in the device of the present invention as a pull up resistor. The resistance of this resistor can be varied by placing the conductive layer 12 at any point along the length of the body R. In this manner in the typical "nand/nor" circuit, no external components or resistors are needed, other than means connected to the gating diodes and the transistor.

It is to be noted that in the device of the present invention, advantage is taken of the bulk resistivity of the semiconductor body R. In this manner, rather than having to use an external resistor, the bulk resistivity of the semiconductor body is used as a built-in or pull up resistor. Since the semiconductor body R has a bulk resistivity, it is desirable to position the diodes 18 as close to the transistor T as possible. The further the diodes 18 are positioned from the transistor T, the greater the resistance that will be interposed between the diodes and the base of the transistor T. It is also to be noted that the conductive layer 12 is positioned at the end of the body R removed from the diodes 18, with the transistor T being positioned between the diodes 18 and the conductive layer 12. The diodes 18 are also spaced equidistant from each other and from the conductive layer 12.

In the foregoing description, reference was had to the fact that the diodes 18 and the transistor T are formed by alloying to the semiconductor body R a metal to form a layer of semiconductor material of opposite conductivity and then etching away the undesired portions. In the preferred form of the invention, however, it is desired that the diodes and the transistor be formed by masked diffusion. In this process the semiconductor body portion R is coated with silicon dioxide. This silicon dioxide coating is then covered with a photographic resist, which is then covered with a plate having the desired pattern and then photographically exposed. The body R is then placed in a bath where the unexposed portion is etched away.

What has been described is a semiconductor gate structure which is a NOR/NAND type of structure and which functions as a fundamental building block. In the device of the present invention a substrate or body serves as one side of a gating diode, as the transistor base and also as the pull up resistor.

I claim as my invention:

A semiconductor logic gate structure in which a plurality of diodes, a resistor and a transistor are combined into one unit, said structure comprising a body of semiconductor material of one conductivity type, one portion of one surface of said body having therein spaced zones of opposite conductivity type so that of said body to form said diodes, another portion of said body spaced from said diodes having in said one surface and the opposed surface zones of a conductivity type opposite to that of said body to form said transistor, a conductive layer on said body with said transistor positioned between said diodes and said conductive layer, said diodes being spaced equidistant from said conductive layer and said diodes being connected to said transistor through said body whereby said body functions as a resistor the resistance of which is a function of the spacing between said diodes, transistor and conductive layer.

References Cited by the Examiner

UNITED STATES PATENTS

| | | | |
|---|---|---|---|
| 2,754,431 | 7/1956 | Johnson | 317—101 |
| 2,816,228 | 12/1957 | Johnson | 317—234 |
| 3,138,721 | 6/1964 | Kilby | 317—234 |

OTHER REFERENCES

Electronics: "Semiconductor Networks for Microelectronics," by Lathrop, May 13, 1960, pp. 69–78.

JOHN W. HUCKERT, *Primary Examiner.*

J. D. CRAIG, *Assistant Examiner.*